(12) United States Patent
Chen et al.

(10) Patent No.: US 9,385,123 B2
(45) Date of Patent: Jul. 5, 2016

(54) STI REGION FOR SMALL FIN PITCH IN FINFET DEVICES

(71) Applicant: International Business Machines Corporation, Armonk, NY (US)

(72) Inventors: Hsueh-Chung Chen, Cohoes, NY (US);
Su Chen Fan, Cohoes, NY (US);
Chiahsun Tseng, Wynantskil, NY (US);
Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/281,931

(22) Filed: May 20, 2014

(65) Prior Publication Data

US 2015/0340272 A1   Nov. 26, 2015

(51) Int. Cl.
| | | |
|---|---|---|
| H01L 21/76 | (2006.01) | |
| H01L 27/088 | (2006.01) | |
| H01L 21/762 | (2006.01) | |
| H01L 27/092 | (2006.01) | |
| H01L 29/06 | (2006.01) | |
| H01L 21/8234 | (2006.01) | |
| H01L 21/8238 | (2006.01) | |

(52) U.S. Cl.
CPC .......... *H01L 27/0886* (2013.01); *H01L 21/762* (2013.01); *H01L 21/76224* (2013.01); *H01L 21/76283* (2013.01); *H01L 21/823431* (2013.01); *H01L 21/823481* (2013.01); *H01L 21/823821* (2013.01); *H01L 21/823878* (2013.01); *H01L 27/0924* (2013.01); *H01L 29/0653* (2013.01)

(58) Field of Classification Search
CPC ................... H01L 21/76224; H01L 21/76283; H01L 27/0886; H01L 27/0924
USPC ..................................... 438/424; 257/E27.06
See application file for complete search history.

(56) References Cited

U.S. PATENT DOCUMENTS

| | | | |
|---|---|---|---|
| 6,642,090 B1 | 11/2003 | Fried et al. | |
| 8,039,326 B2 | 10/2011 | Knorr et al. | |
| 8,120,094 B2 | 2/2012 | Liaw et al. | |
| 8,461,008 B2 | 6/2013 | Cho | |
| 8,617,996 B1 * | 12/2013 | Chi ................ | H01L 21/30604 257/E21.377 |
| 2009/0206400 A1 | 8/2009 | Juengling | |
| 2009/0321836 A1 | 12/2009 | Wei et al. | |
| 2010/0015778 A1 | 1/2010 | Lin et al. | |
| 2011/0068431 A1 | 3/2011 | Knorr et al. | |
| 2011/0151674 A1 | 6/2011 | Tang et al. | |

(Continued)

OTHER PUBLICATIONS

IBM: List of IBM Patents or Patent Applications Treated As Related (Appendix P), Sep. 16, 2015 , 2 pages.

(Continued)

*Primary Examiner* — Robert Huber
(74) *Attorney, Agent, or Firm* — L. Jeffrey Kelly; Steven Meyers

(57) ABSTRACT

The present invention relates generally to semiconductor devices, and particularly to fabricating a shallow trench isolation (STI) region in fin field effect transistors (FinFETs) having a small fin pitch. According to one embodiment, a method of using selective etching techniques to remove a single fin to form a fin trench and to form an isolation trench having a width approximately equal to a width of the single fin below the removed fin is disclosed. The fin trench and the isolation trench may be filled with isolation material to form an isolation region.

8 Claims, 9 Drawing Sheets

(56) References Cited

U.S. PATENT DOCUMENTS

2012/0049294 A1\* 3/2012 Chen ............... H01L 21/823431
      257/401
2013/0330889 A1\* 12/2013 Yin ................. H01L 21/823821
      438/197
2015/0069528 A1 3/2015 Chiang et al.

OTHER PUBLICATIONS

Pending U.S. Appl. No. 14/828,551, filed Aug. 18, 2015 entitled: "STI Region for Small Fin Pitch in FinFET Devices", 20 pages.

\* cited by examiner

STI REGION FOR SMALL FIN PITCH IN FINFET DEVICES

BACKGROUND

The present invention relates to semiconductor devices, and particularly to fabricating a shallow trench isolation (STI) region in fin field effect transistors (FinFETs) having a small fin pitch.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFET structures may be formed on a semiconductor-on-insulator (SOI) substrate because of the low source/drain diffusion, low substrate capacitance, and ease of electrical isolation by STI structures. FinFETs may be also formed on bulk substrates to reduce wafer cost and/or enable formation of certain devices in the bulk substrate.

SUMMARY

In an embodiment, a method is disclosed. The method may include: forming a plurality of fins in a semiconductor substrate; forming a plurality of caps on the plurality of fins; forming an isolation layer on the semiconductor substrate and between the plurality of fins, the isolation layer having an upper surface that is substantially flush with an upper surface of the plurality of caps; forming a patterning layer above the plurality of caps and above the isolation layer; removing a portion of the patterning layer to form an opening above one of the plurality of fins to expose at least a portion of one of the plurality of caps; removing the one of the plurality of caps selective to the patterning layer, the isolation layer, and the one of the plurality of fins to expose the one of the plurality of fins; removing the one of the plurality of fins selective to the patterning layer, the isolation layer, and the semiconductor substrate to expose a portion of the semiconductor substrate and to form a fin trench; forming an isolation trench in the exposed portion of the semiconductor substrate, the isolation trench having a width that is approximately equal to a width of the one of the plurality of fins; and filling the fin trench and the isolation trench with an insulating material to form an isolation region.

In another embodiment, a method is disclosed. The method may include: removing one of a plurality of fins from a fin field effect transistor (FINFET) device using a selective etching process to form a fin trench in an isolation layer, the fin trench extending from an upper surface of the isolation layer to an upper surface of a semiconductor substrate; and forming an isolation trench in the semiconductor substrate directly below the fin trench, the isolation trench having a width that is approximately equal to a width of the one of the plurality of fins.

In another embodiment, a structure is disclosed. The structure may include: a semiconductor substrate; a plurality of fins on the semiconductor substrate; a plurality of caps on the fins; an isolation layer on the semiconductor substrate and between the plurality of fins, the isolation layer having an upper surface that is substantially flush with an upper surface of the plurality of caps; an isolation trench in the semiconductor substrate; a fin trench where one of the plurality of fins and one of the plurality of caps have been removed; and insulating material in the isolation trench and the fin trench to form an isolation region, the isolation region having an upper surface that is substantially flush with the upper surface of the isolation layer.

In another embodiment, a structure is disclosed. The structure may include: a semiconductor substrate; a plurality of fins on the semiconductor substrate; a plurality of caps on the fins; an isolation layer on the semiconductor substrate and between the plurality of fins, the isolation layer having an upper surface that is substantially flush with an upper surface of the plurality of caps; an isolation trench in the semiconductor substrate, the isolation trench having an entire width that is approximately equal to an entire width of one of the plurality of fins; a fin trench where one of the plurality of fins and one of the plurality of caps have been removed; and insulating material in the isolation trench and the fin trench to form an isolation region, the isolation region having an upper surface that is substantially flush with the upper surface of the isolation layer.

In another embodiment, a structure is disclosed. The structure may include: a semiconductor substrate; a plurality of fins on the semiconductor substrate; a plurality of caps on the fins; an isolation layer on the semiconductor substrate and between the plurality of fins, the isolation layer having an upper surface that is substantially flush with an upper surface of the plurality of caps; an isolation trench in the semiconductor substrate, the isolation trench having an entire width that is greater than an entire width of one of the plurality of fins; a fin trench where one of the plurality of fins and one of the plurality of caps have been removed; and insulating material in the isolation trench and the fin trench to form an isolation region, the isolation region having an upper surface that is substantially flush with the upper surface of the isolation layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
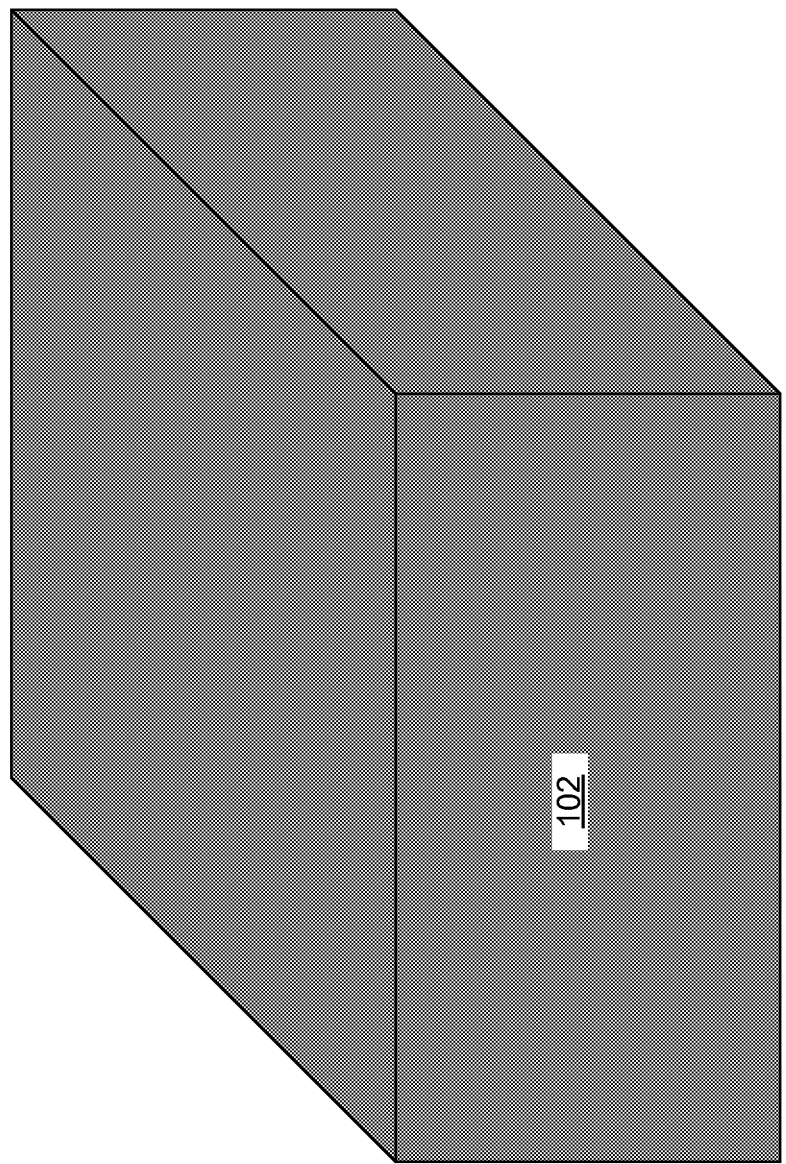
FIG. 1 is an isometric view of substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices, and particularly to fabricating a shallow trench isolation (STI) region in fin field effect transistors (FinFETs) having a small fin pitch.

As semiconductor devices generally continue to decrease in size, the pitch of individual fins of an array of FinFETs has also become smaller. The smaller spaces between the fins may make it difficult to fabricate an isolation trench between adjacent fins formed on a substrate using conventional photolithography processes. Current techniques used to fabricate isolation trenches may result in the damage of or the removal of multiple due to limitations in conventional photolithography and etching techniques such as, for example, pattern transfer fidelity and minimal pattern pitch. An embodiment in which only a single fin may be removed during STI formation is described in detail below with reference to FIGS. 1-9.

Referring now to FIG. 1, an isometric view of substrate 102 is shown. The substrate 102 may be either a bulk substrate or a semiconductor on insulator (SOI) substrate. The substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate 102 may be about, but is not limited to, several hundred microns thick. For example, the substrate 102 may include a thickness ranging from 0.5 mm to about 1.5 mm. In an embodiment, the substrate 102 may be doped with p-type dopants such as boron in a PFET region or doped with n-type dopants such as phosphorus and/or arsenic in a NFET region. The dopant concentration may range from approximately $1 \times 10^{15}$ cm$^{-3}$ to approximately $1 \times 10^{19}$ cm$^{-3}$, preferably approximately $1 \times 10^{15}$ cm$^{-3}$ to approximately $1 \times 10^{16}$ cm$^{-3}$.

In an embodiment in which the substrate 102 is a SOI substrate, the substrate 102 may include a base layer, an insulator, or middle layer, and a SOI layer. The insulator layer may isolate the SOI layer from the base layer.

The insulator layer may be formed by growing an epitaxial insulator material on the base layer. The base layer may be substantially similar to the substrate 102. The insulator layer may be made, for example, of any known insulator capable of forming an epitaxial layer on the base layer and supporting epitaxial growth of the SOI layer, including, for example, rare-earth oxides such as scandium oxide ($Sc_2O_3$) cadmium oxide ($Cd_2O_3$), yttrium oxide ($Y_2O_3$), scandium oxide ($Sc_2O_3$), lanthanum oxide ($La_2O_3$), praseodymium oxide ($Pr_2O_3$), thorium oxide ($ThO_2$), actinium oxide ($Ac_2O_3$), Gadolinium Oxide ($Gd_2O_3$), Strontium Titanate ($SrTiO_3$), and Barium Titanate ($BaTiO_3$), and may have a thickness of approximately 10 nm to approximately 500 nm. In one embodiment, the insulator layer may have a thickness of approximately 150 nm.

The SOI layer may be made of any of the several semiconductor materials possible for the base layer capable of being forming epitaxial layers on the insulator layer. In general, the base layer and the SOI layer may include either identical or different semiconducting materials with respect to chemical composition, dopant concentration and crystallographic orientation. The SOI layer may be doped with p-type dopants such as boron or doped with n-type dopants such as phosphorus and/or arsenic. The dopant concentration may range from approximately $1 \times 10^{15}$ cm$^{-3}$ to approximately $1 \times 10^{19}$ cm$^{-3}$, preferably approximately $1 \times 10^{15}$ cm$^{-3}$ to approximately $1 \times 10^{16}$ cm$^{-3}$. In one embodiment, the SOI layer is undoped.

The SOI layer may be approximately 5 nm to approximately 300 nm thick, preferably approximately 30 nm.

Figure 2:
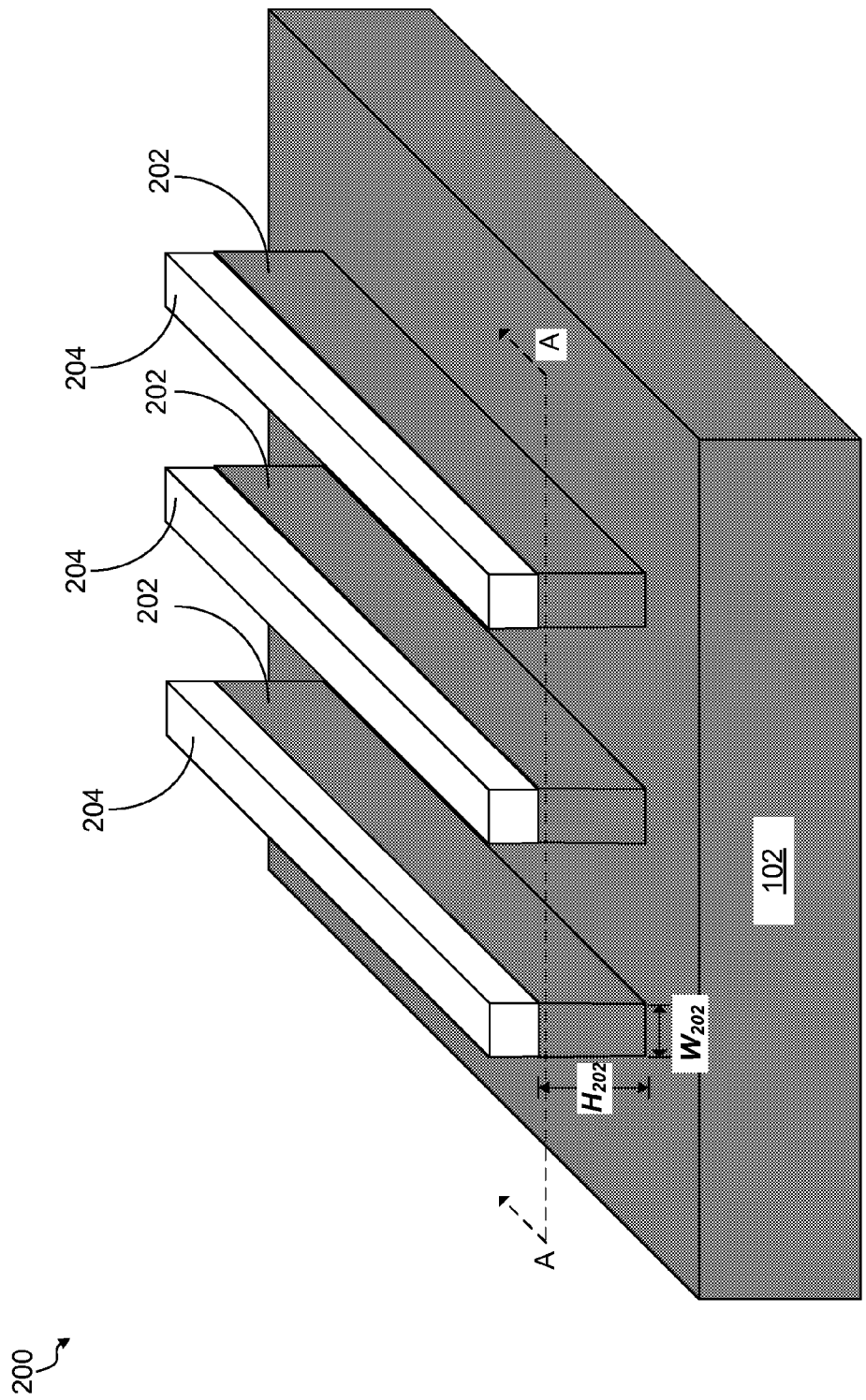
FIG. 2 is an isometric view of the substrate illustrating forming fins having caps on the substrate, according to an embodiment of the present invention.

Referring to FIG. 2, an isometric view of the substrate 102 is shown after the formation of fins 202 to form a structure 200. The fins 202 may be formed by removing material from the substrate 102 using, for example, a photolithography process followed by an anisotropic etching process such as reactive ion etching (RIE) or plasma etching. In an embodiment in which the substrate 102 is a SOI substrate, the fins may be formed by removing material from the SOI layer.

The fins 202 may have a width $W_{202}$ of approximately 2 nm to approximately 100 nm, preferably approximately 5 nm to approximately 20 nm and a height $H_{202}$ of approximately 5 nm to approximately 300 nm, preferably approximately 10 nm to approximately 50 nm. In an embodiment, a hard mask layer may be incorporated into the etching process to protect the fins 202 during their formation. The hard mask layer may remain on the fins 202 as caps 204. In another embodiment, a nitride layer may be formed on the substrate 102 before the etching process, and the caps 204 may be composed of a silicon nitride. While the depicted embodiment includes three fins, it will be understood that other embodiments may include one or more fins. FIGS. 3-9 illustrate subsequent processing steps along section line A-A.

Figure 3:
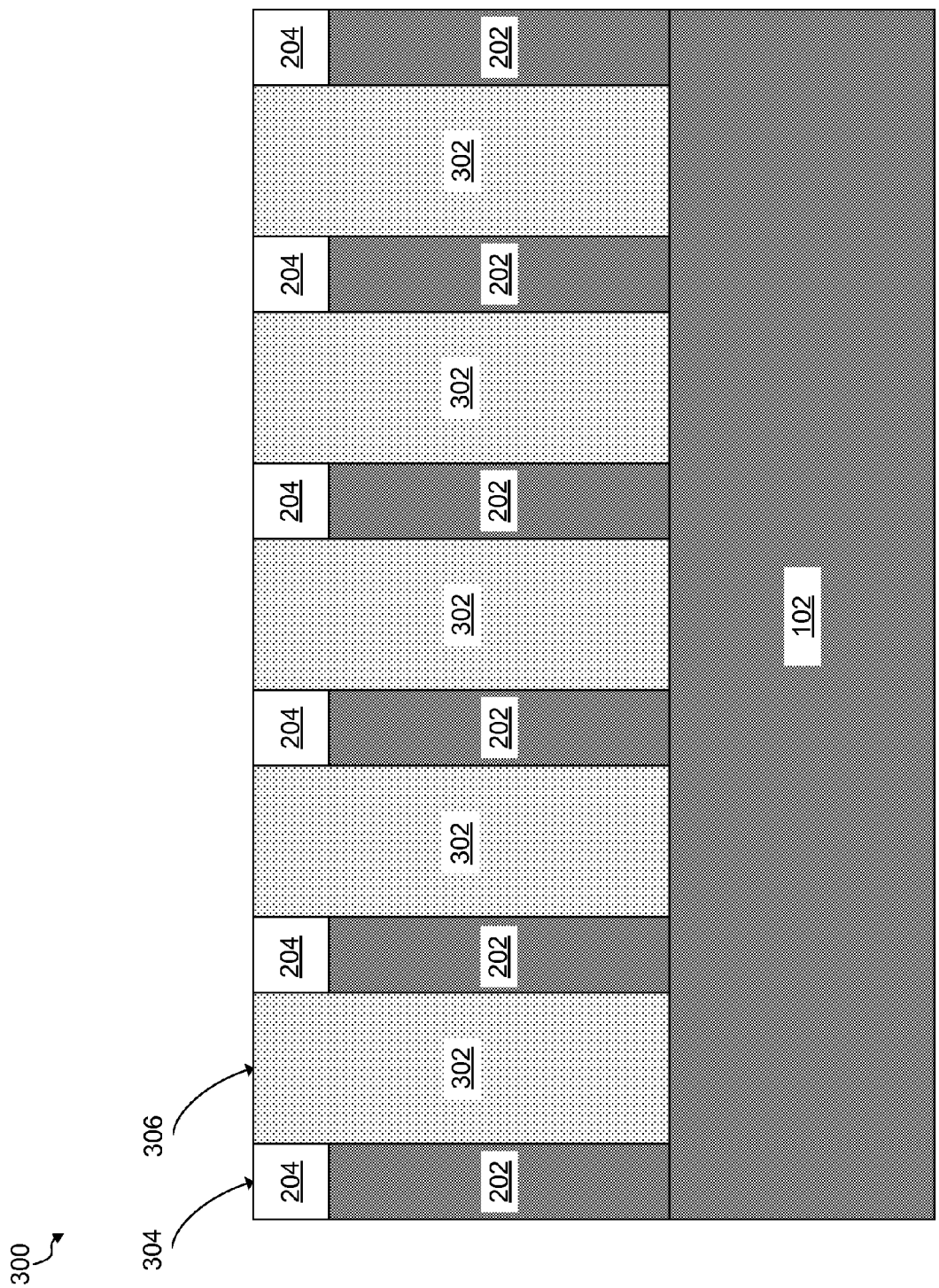
FIG. 3 is a cross-section view illustrating forming an isolation layer between the fins, according to an embodiment of the present invention.

Referring now to FIG. 3, a cross-section view of a structure 300 is shown. FIG. 3 illustrates forming an isolation layer 302 on the structure 200 (FIG. 2) between the fins 202. In an embodiment, the isolation layer 302 may be composed of an oxide, such as, for example, silicon dioxide. The isolation layer 302 may be formed by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). In an embodiment, the isolation layer 302 may be planarized, using any suitable technique in known in the art, such as, for example chemical mechanical planarization (CMP), so that an upper surface 306 of the isolation layer 302 is substantially flush with an upper surface 304 of the caps 204.

Figure 4:
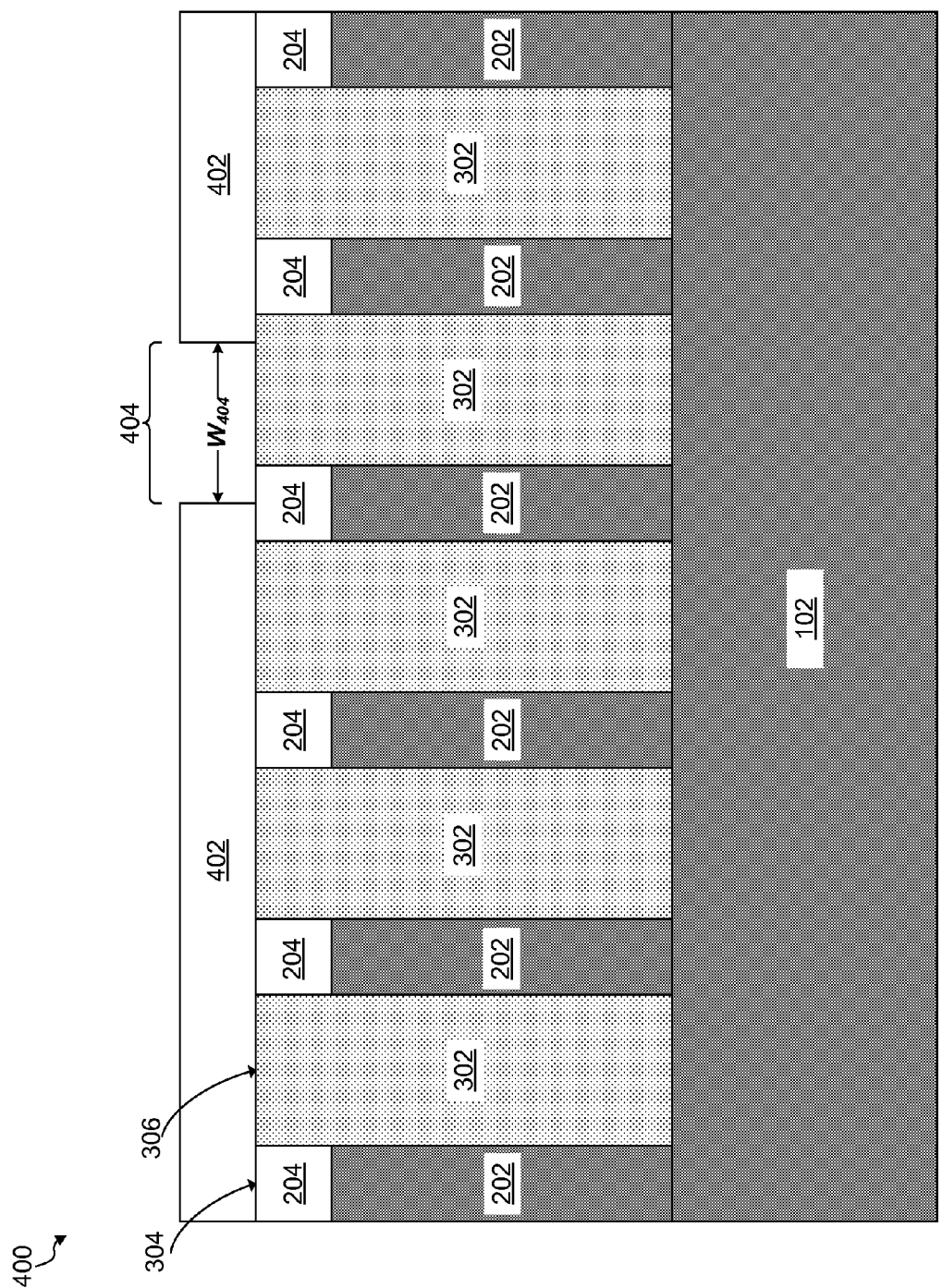
FIG. 4 is a cross-section view illustrating forming a patterning layer and opening, according to an embodiment of the present invention.

Referring now to FIG. 4, a cross-section view of a structure 400 is shown. FIG. 4 illustrates forming a patterning layer 402 on the structure 300 (FIG. 3), and more specifically, on the upper surface 304 of the caps 204 and the upper surface 306 of the isolation layer 302. In an embodiment, the patterning layer 402 may be composed of a photoresist material, such as, for example, an organic planarization layer (OPL) with a titanium anti-reflective coating (ARC) layer formed thereon. In another embodiment, the patterning layer 402 may be composed of a hard mask material, such as, for example, a high-k dielectric, including, but not limited to, $HfO_2$, $Al_2O_3$, and $La_2O_3$. An opening 404 may be formed in the patterning layer 402 over a single cap 204 and corresponding fin 202. The opening 404 may have a width $W_{404}$ ranging from approximately 10 nm to approximately 50 nm. In an embodiment, the opening 404 may only expose a portion of the single cap 204. In another embodiment, the opening 404 may expose an entire width of the single cap 204. In another embodiment, the opening 404 may expose at least a portion of the single cap 204 as well as at least a portion of the isolation layer 302 on either side of the single cap 204. The opening 404 may not expose any portion of two caps 204.

Figure 5:
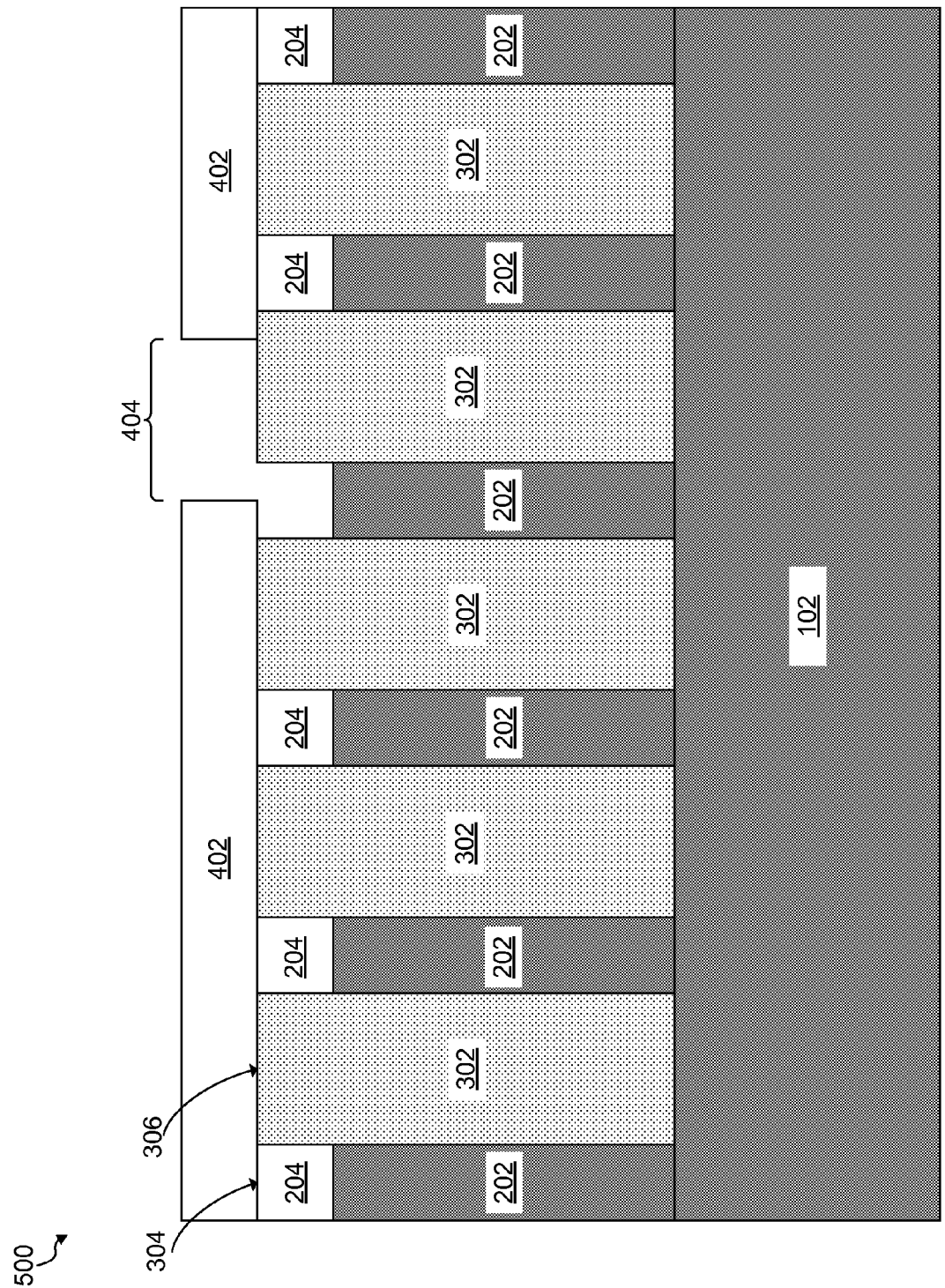
FIG. 5 is a cross-section view illustrating removing a cap exposed by the opening, according to an embodiment of the present invention.

Referring now to FIG. 5, a cross-section view of a structure 500 is shown. FIG. 5 illustrates removing a single cap 204 exposed by the opening 404 in the structure 400 (FIG. 4). In an embodiment, an isotropic etching process using an in-situ dry chemical etch, such as, for example a SiConi™ etch, may be used to remove the single cap 204 selective to the patterning layer 402, the isolation layer 302, and the fins 202. The SiConi™ etch is a remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The SiConi™ etch is largely conformal and selective towards silicon oxide layers but does not readily etch silicon regardless of whether the silicon is amorphous, crystalline or polycrystalline. The selectivity provides advantages for applications such as STI and inter-layer dielectric (ILD) recess formation. In another embodiment, a conventional isotropic wet etch may be used. In an embodiment in which the patterning layer 402 is composed of a hard mask material, a hot phosphorous wet removal may used to remove the cap 204.

Figure 6:
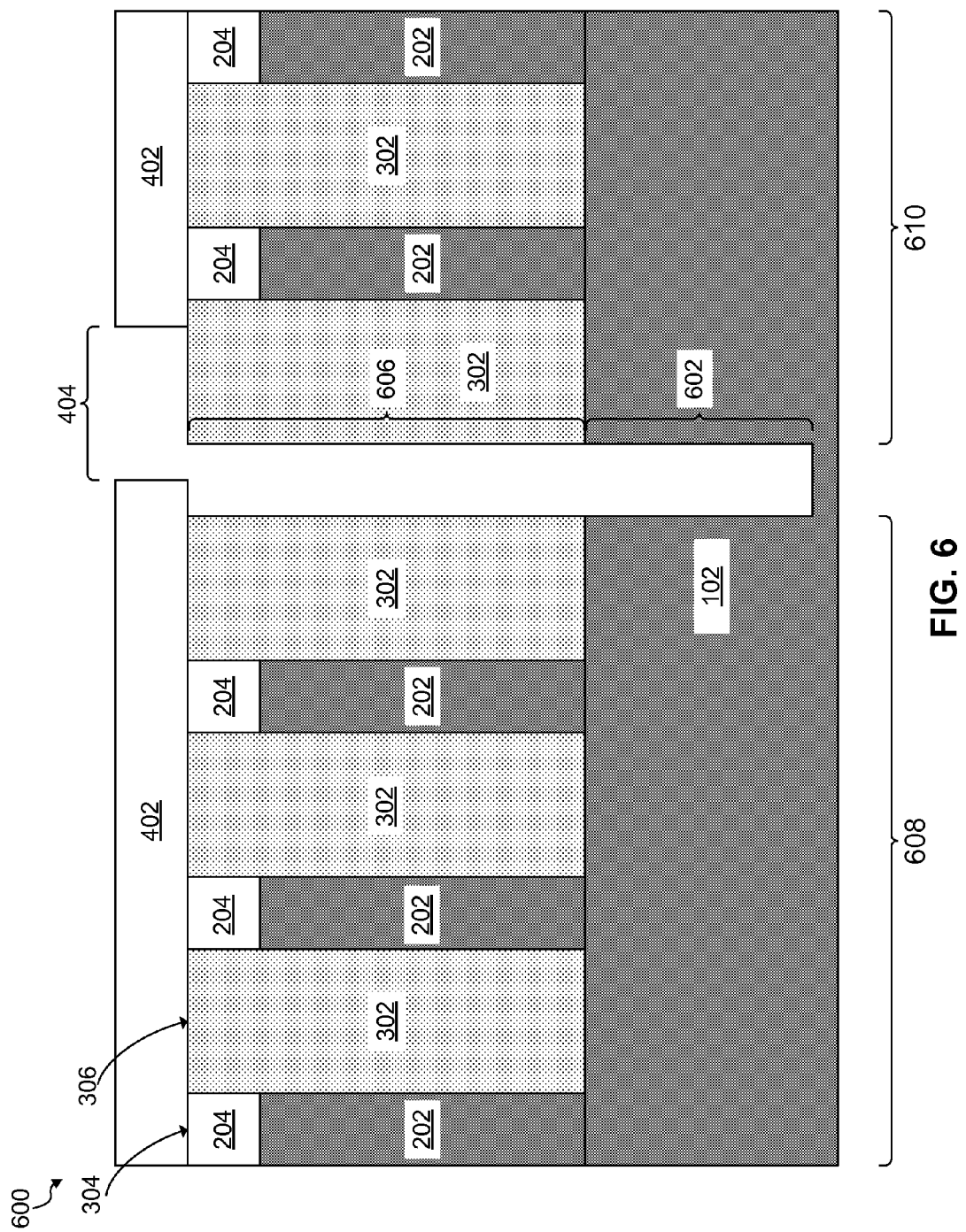
FIG. 6 is a cross-section view illustrating removing a single to form a fin trench and forming an isolation trench in the substrate, according to an embodiment of the present invention.

Referring now to FIG. 6, a cross-section view a structure 600 is shown. FIG. 6 illustrates removing a single fin 202 to form a fin trench 606 and forming an isolation trench 602 in the substrate 102 directly below the single fin 202 in the structure 500 (FIG. 5). The isolation trench 602 may have the same width as the single fin 202. The single fin 202 may be removed and the isolation trench 602 may be formed by performing a dry etch that is selective to the patterning layer 402 and the isolation layer 302. In an embodiment, the single fin 202 may be removed and the isolation trench 602 may be formed by a high aspect reactive ion etching (RIE) process. The isolation trench 602 may separate a NFET region 608 and a PFET region 610.

Figure 7:
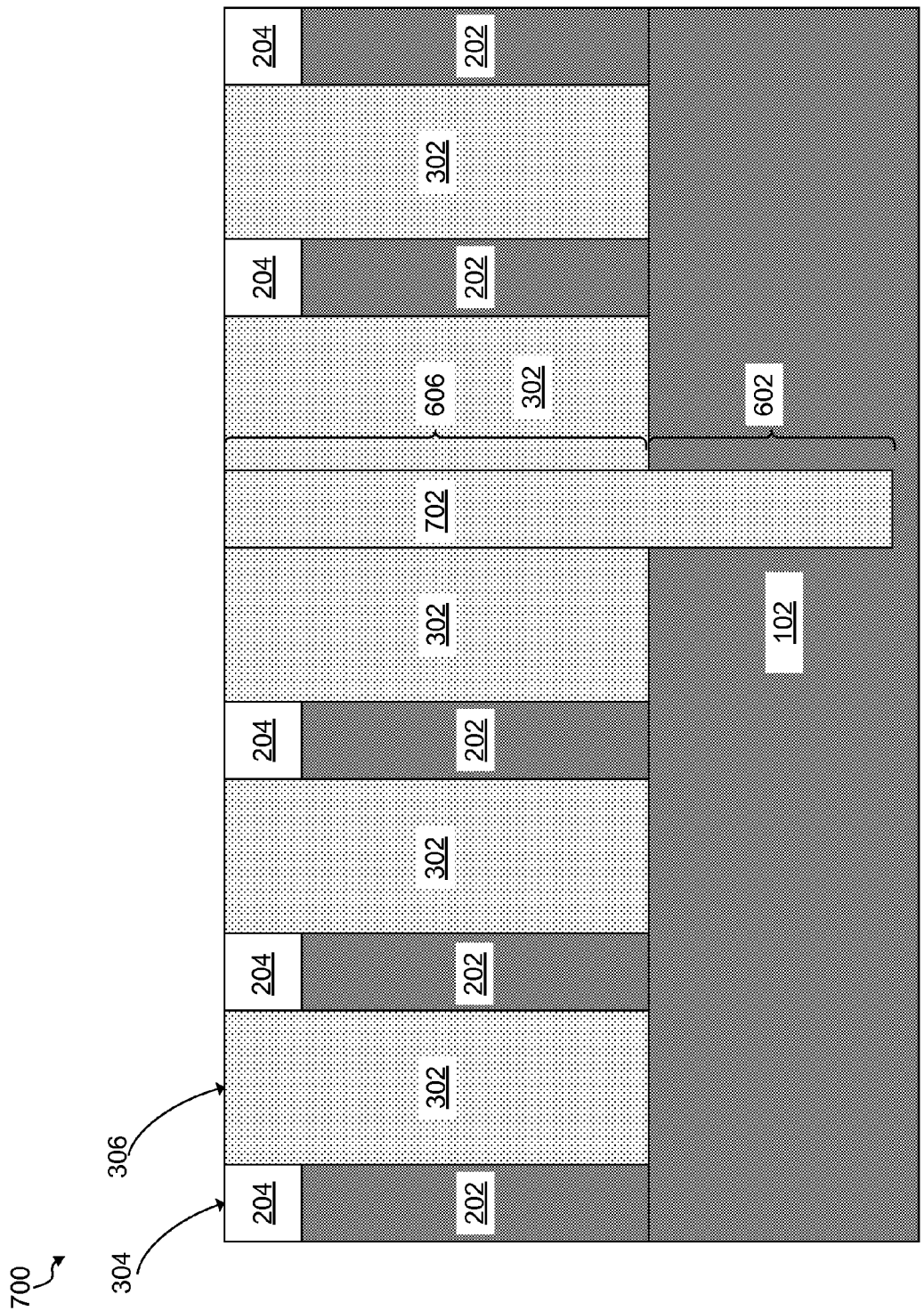
FIG. 7 is a cross-section view illustrating removing the patterning layer and filling the fin trench and the isolation trench with an isolation material to form an isolation region, according to an embodiment of the present invention.

Referring now to FIG. 7, a cross-section view of a structure 700 is shown. FIG. 7 illustrates removing the patterning layer 402 (FIG. 6) from the structure 600 (FIG. 6) and filling the fin trench 606 and the isolation trench 602 with an isolation material 702 to form an isolation region 702. In an embodiment, the patterning layer 402 (FIG. 6) may be removed using a planarization process, such as, for example, chemical mechanical planarization (CMP). In another embodiment, the patterning layer 402 (FIG. 6) may be removed using an etching process, such as, for example, a wet etch. In an embodiment, the fin trench 606 and the isolation trench 602 may be filled with isolation material that is substantially similar to the isolation layer 302 and may be formed using substantially similar techniques as those described above with reference to FIG. 3.

Another embodiment by which to form an isolation region is described in detail below by referring to the accompanying drawings FIGS. 8-9. In the present embodiment, a wide isolation trench may be formed in the substrate by widening the isolation trench 602. Like above, each of the figures is a cross-section view along the section line A-A (FIG. 2). It should be noted that the following stages of fabrication of the present embodiment described below may be preceded by the fabrication stages described above with reference to FIGS. 1-6. As such, the following description may continue after the description of FIG. 6.

Figure 8:
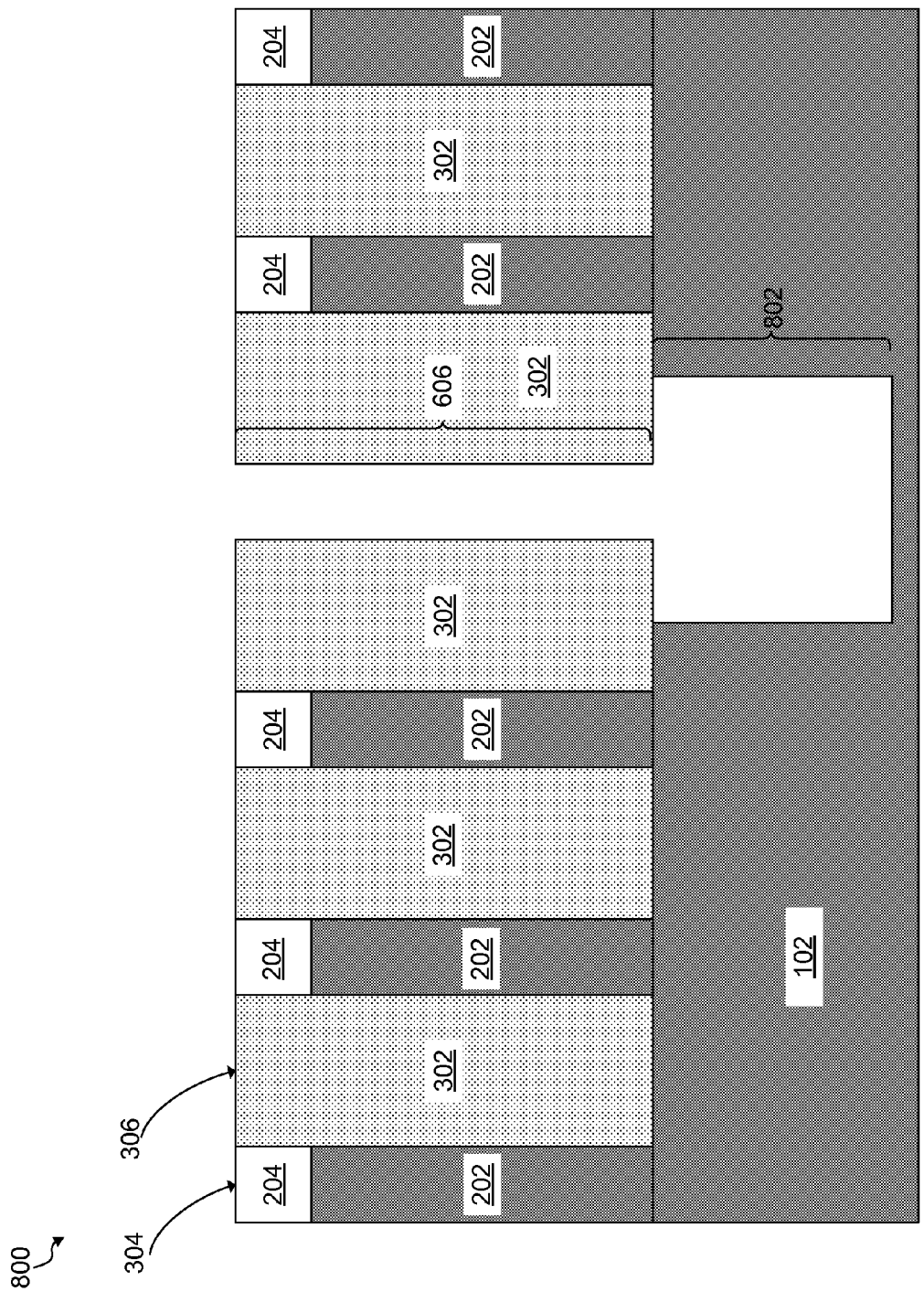
FIG. 8 is a cross-section view illustrating forming a wide isolation trench in the substrate, according to an embodiment of the present invention.

Referring now to FIG. 8, a cross-section view of a structure 800 is shown. FIG. 8 illustrates forming a wide isolation trench 802 in the substrate 102 after the isolation trench 602 (FIG. 6) is formed in the structure 600 (FIG. 6). In an embodiment, the patterning layer 402 (FIG. 6) may be removed by similar techniques as those described above with reference to FIG. 7. The wide isolation trench 802 may be formed by performing an etching process, such as, for example a lateral etch, or a silicon dry etch with modified etch chemistry to become more isotropic, to laterally etch the substrate 102 from sidewalls of the isolation trench (FIG. 6). The wide isolation trench 802 may provide better isolation between the NFET region 608 (FIG. 6) and the PFET region 610 (FIG. 6) because the enlarged physical distance may prevent current leakage between the two different types of devices. The etching technique used to form the wide isolation trench 802 may be selective to the isolation layer 302 and the caps 204 so that the substrate 102 is removed at a much higher rate.

Figure 9:
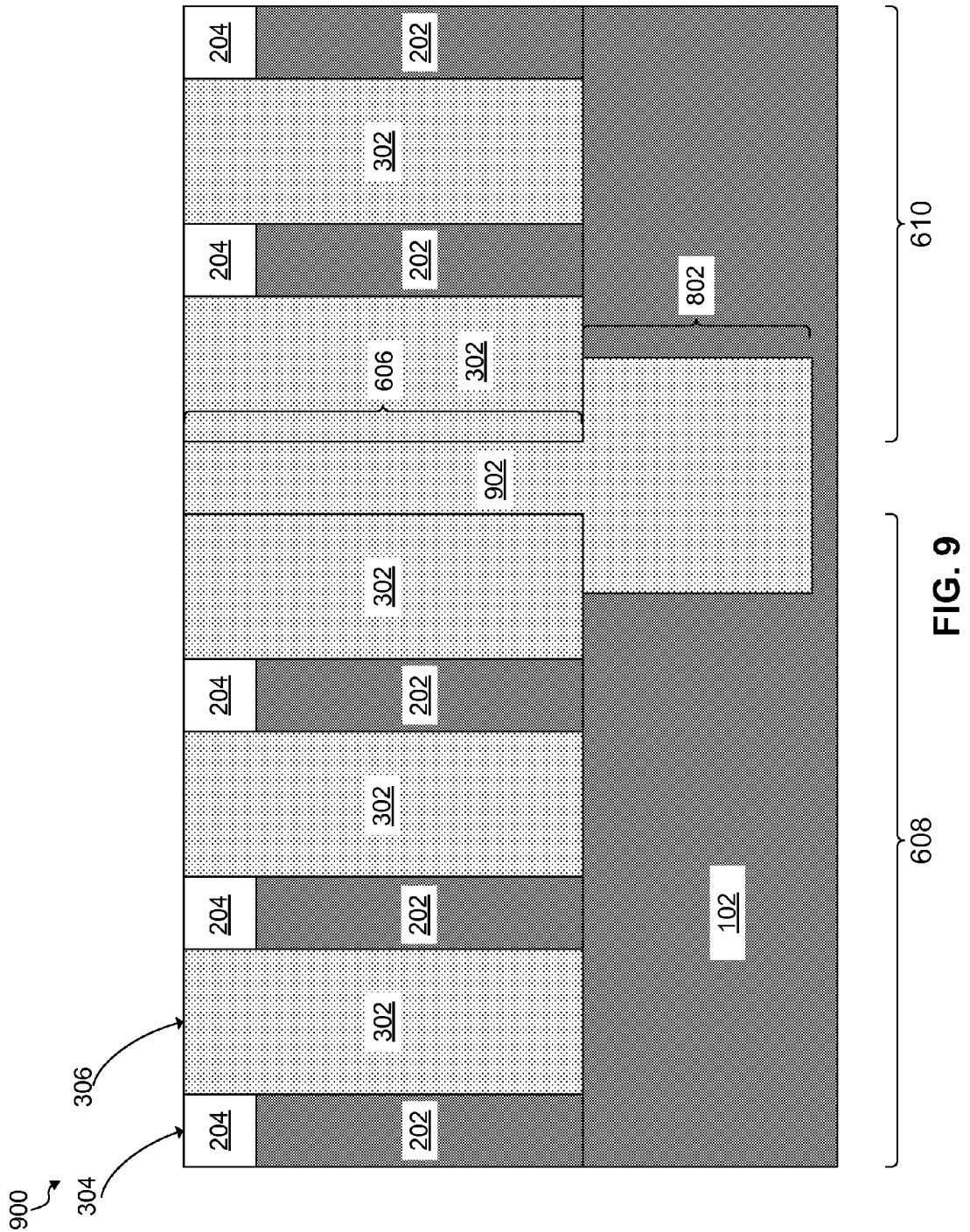
FIG. 9 is a cross-section view illustrating forming an isolation region after the wide isolation trench is formed, according to an embodiment of the present invention.

Referring now to FIG. 9, a cross-section view of a structure 900 is shown. FIG. 9 illustrates forming an isolation region after the wide isolation trench 802 is formed. The wide isolation trench 802 may be filled with the isolation material as described above with reference to FIG. 7 to form an inverted T-shaped isolation region 902.

Embodiments of the present invention may allow for the formation of an isolation trench with improved overlay and pattern fidelity as compared to conventional techniques. In addition, because of the etch selectivity used, embodiments may allow for the removal of a single fin and formation of an isolation trench as opposed to conventional techniques which may require the removal of more than one fin. This may improve device density as well as isolation between different devices. Conventional fin etching techniques may require a very narrow opening centered on, and exposing, the entire width of one fin to form an isolation trench and may actually cause damage to an adjacent fin. This may necessitate the removal of two adjacent fins. In the present embodiment, the opening used to form an isolation trench may only need to expose a portion of one cap, or may extend across the isolation layer on either side of the fin, to remove a single fin without leading to damage of an adjacent fin.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method, comprising:
   forming an isolation layer between a plurality of caps on a plurality of fins, wherein an upper surface of the isolation layer is substantially flush with an upper surface of the plurality of caps;
   forming a patterning layer on the isolation layer and on the plurality of caps;
   removing a portion of the patterning layer to form an opening above one of the plurality of fins to expose at least a portion of one of the plurality of caps;
   removing the one of the plurality of caps selective to the patterning layer, the isolation layer, and the one of the plurality of fins to expose the one of the plurality of fins;
   removing one of the plurality of fins from a fin field effect transistor (FINFET) device using a selective etching process to form a fin trench in the isolation layer, the fin trench extending from an upper surface of the isolation layer to an upper surface of a semiconductor substrate;
   forming an isolation trench in the semiconductor substrate directly below the fin trench, the isolation trench having a width that is approximately equal to a width of the one of the plurality of fins; and
   filling the isolation trench and the fin trench with an insulating material to form an isolation region, the isolation region having an upper surface that is substantially flush with the upper surface of the isolation layer.

2. The method of claim 1, wherein the semiconductor substrate is a bulk substrate.

3. The method of claim 1, wherein the semiconductor substrate is a semiconductor on insulator (SOI) substrate.

4. The method of claim 1, wherein the isolation trench is formed between a n-type field effect transistor (NFET) region of the semiconductor substrate and a p-type field effect transistor (PFET) region of the semiconductor substrate.

5. The method of claim 1, further comprising:
   widening the isolation trench using a lateral etch to form a wide isolation trench in the semiconductor substrate.

6. The method of claim 1, wherein the opening has a minimum width approximately equal to a portion of the one of the plurality of caps and a maximum width approximately equal to a width of the one of the plurality of caps and a width of adjacent portions of the isolation layer on either side of the one of the plurality of caps.

7. The method of claim 1, wherein the patterning layer comprises a hard mask material.

8. The method of claim 1, wherein the width of the opening is greater than the width of the fin trench and the width of the isolation trench.

* * * * *